(12) United States Patent
Chen

(10) Patent No.: US 6,899,919 B2
(45) Date of Patent: May 31, 2005

(54) METHOD OF MAKING A HIGH SURFACE AREA ELECTRODE

(76) Inventor: Jack Chen, 14 Kimberly Cir., Oak Brook, IL (US) 60521

( * ) Notice: Subject to any disclaimer, the term of this patent is extended or adjusted under 35 U.S.C. 154(b) by 155 days.

(21) Appl. No.: 10/348,069

(22) Filed: Jan. 21, 2003

(65) Prior Publication Data

US 2004/0142097 A1 Jul. 22, 2004

(51) Int. Cl.[7] .................................................. B05D 5/12
(52) U.S. Cl. ..................... 427/126.3; 427/79; 427/115; 427/123; 427/197; 427/282; 427/383.1
(58) Field of Search ........................... 427/58, 79, 123, 427/126.3, 197, 199, 282, 283, 383.1, 115; 118/406, 407, 600

(56) References Cited

U.S. PATENT DOCUMENTS

| | | | |
|---|---|---|---|
| 3,403,303 A | 9/1968 | Klein | |
| 3,465,426 A | 9/1969 | Baier | |
| 3,765,938 A | 10/1973 | Cranston | |
| 4,794,018 A | * 12/1988 | Scheetz | 427/96 |
| 4,938,994 A | * 7/1990 | Choinski | 427/96 |
| 5,817,374 A | 10/1998 | Detig | |
| 5,963,417 A | * 10/1999 | Anderson et al. | 361/503 |
| 6,033,967 A | 3/2000 | Li | |
| 6,224,985 B1 | * 5/2001 | Shah et al. | 428/469 |
| 6,340,090 B1 | 1/2002 | Jahani | |
| 6,356,432 B1 | 3/2002 | Danel | |
| 6,361,824 B1 | 3/2002 | Yekimov | |
| 6,428,842 B1 | * 8/2002 | Chiavarotti et al. | 427/80 |

FOREIGN PATENT DOCUMENTS

| | | | |
|---|---|---|---|
| JP | 401248619 A | 10/1989 | |
| JP | 404065813 A | 3/1992 | |

* cited by examiner

*Primary Examiner*—Brian K. Talbot
(74) *Attorney, Agent, or Firm*—Robert L. Marsh

(57) ABSTRACT

A high surface area electrode is made by retaining an electrode blank with one surface thereof horizontal and facing upward. The surface is then submerged in a liquid having particles of conductive material suspended therein. The particles in suspension are then allowed to precipitate out and onto the surface of the electrode. This process is repeated until a porous layer of particles of the desired thickness has formed on the surface. As a final step the particles are bonded to the surface using an appropriate bonding method such as a heat treatment.

13 Claims, 5 Drawing Sheets

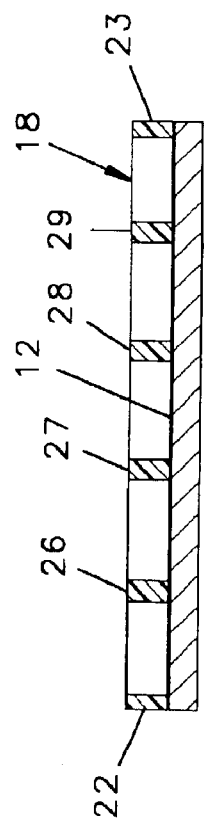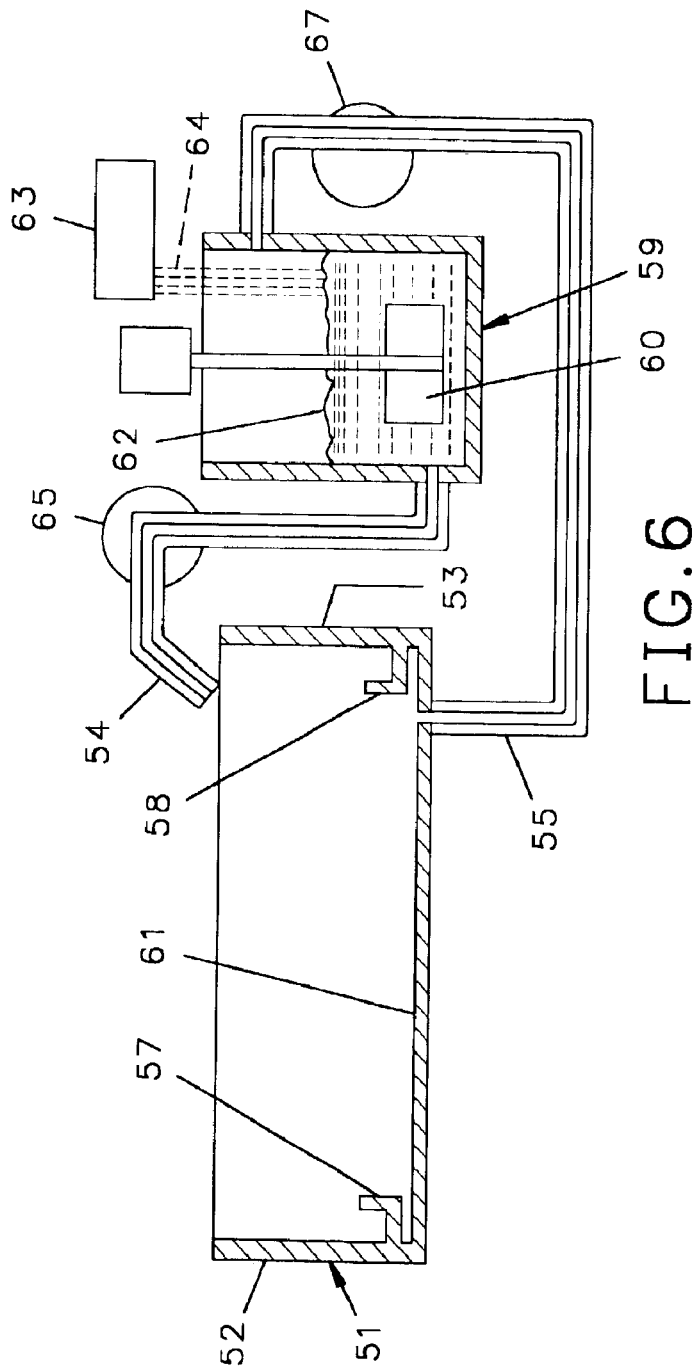

METHOD OF MAKING A HIGH SURFACE AREA ELECTRODE

The present invention relates to a method of manufacturing an electrode for a battery or a capacitor, and in particular, for a high surface area electrode for a super capacitor.

BACKGROUND OF THE INVENTION

A capacitor has two parallel plates separated by a non-conductive medium such that electric energy can be stored by receiving a positive charge on one plate and a negative charge on the other. The storage capability of the capacitor is related to the capacitance C by the formula:

$$U = \tfrac{1}{2}CV^2$$

where U is the potential energy, C is the capacitance and V is the potential difference between the plates. The capacitance is then related to the area of the plates by the formula:

$$C = \Sigma A/d$$

where Σ is the dielectric constant of the media separating the plates, d is the distance between the plates, and A is the surface area of the plates. By combining these two formulas it can be seen that the energy storage capabilities of a capacitor are increased by reducing the distance between the plates and increasing the surface area of the plates. The minimum distance between the plates is limited by the insulating qualities of the dielectric material. The capacitor will fail if the charge on the plates exceeds the insulating capacity of the dielectric material and arcing occurs between the plates. The only limit to increasing the area of the plates is the practical limitation of size. A capacitor capable of retaining massive amounts of electric potential energy might require an unacceptably large volume of space.

The charge of a capacitor is stored on the surface of the electrodes, and a super capacitor, that is, a capacitor which can retain many times the potential energy of a convention capacitor, can be made by providing electrodes having surfaces configured to provide enhanced surface area for receiving a charge. Such electrodes have porous surfaces, which by virtue of the irregularities of the pores, have greater surface area and therefore can retain a greater number of electrons thereon.

There are many methods of forming a porous surface on an electrode. One common method is to suspend metal oxide particles in a slurry into which the electrode is dipped, leaving a coating of metal oxide on the surface thereof. After the coating is applied, the electrode is heat treated to bond the coating to the surface of the electrode. The electrode can then be dipped in the slurry again to apply a second layer of the metal oxide, thereby thickening the coating of metal oxide on the surface of the electrode. By applying multiple layers, the thickness of the coating is increased thereby increasing the effective surface area of the electrode and correspondingly increasing the capacitance of the capacitor into which the electrode is incorporated. A super capacitor having electrodes with porous surfaces as described above will have an exponentially larger capacitance than a capacitor of corresponding size.

While super capacitors are highly desirable, the multiplicity of steps needed to develop a sufficiently thick layer of porous electrically conductive material, especially the heat treatments following each dipping process, are costly. It would be desirable, therefore, to provide a less expensive method of manufacturing an electrode for a super capacitor.

SUMMARY OF THE INVENTION

Briefly, the present invention is embodied in a method of making a high surface area electrode. In accordance with the invention, a container is provided for retaining a quantity of liquid. The container has an input line controlled by an input valve through which liquid can be added to the container, and a drain line controlled by a drain valve through which liquid in the container can be released.

A generally planar electrically conductive electrode blank is provided. The electrode blank is preferably made of a suitable metal and has a generally planar surface upon which a layer of porous conductive material, such as metal oxide may be deposited.

Positioned within the container is a retainer for supporting the electrode blank with the generally planar surface maintained horizontal and facing upwardly. A frame is then positioned around a portion of the generally planar surface to form a barrier for retaining a quantity of liquid above the enclosed portion of the surface and within the boundaries of the frame. The frame further includes one or more drainage canals, or small openings, through which liquid trapped within the boundaries of the frame and above the generally planar surface of the electrode blank can be allowed to slowly escape.

A liquid having particles of conductive material, such as metal oxide, suspended therein is provided and introduced through the input line into the container until the surface level of the liquid is above the electrode blank and above the frame around a portion of the surface of the electrode blank. Once the blank and the frame are submerged below the surface level of the liquid, the valve controlling the introduction of liquid into the container is closed and the valve allowing liquid to drain therefrom is opened, allowing the liquid in the container to slowly drain away. As the liquid in the container drains away, a pool of liquid with particles of metal oxide suspended therein is trapped within the barriers formed by the frame above the portion of the planar surface of the electrode blank. Thereafter, the liquid trapped within the frame will slowly drain away through the small openings. As the liquid drains out of the pool, particles of metal oxide will precipitate out of the liquid and settle on the horizontal surface of the blank, forming a coating.

After the pool of liquid trapped in the frame has completely drained away, the drain valve is closed and the input valve is opened and the container refilled with more of the liquid having particles of conductive material suspended therein. By repeatedly filling and draining the container, multiple layers of metal oxide material will be applied to the surface of the blank thereby increasing the thickness of the porous material deposited thereon.

In accordance with the invention, after the layer of porous material has obtained the desired thickness, the electrode blank may be removed from the container and heat-treated to cure the metal oxide coating thereon and bind it to the surface of the blank to form an electrode with a porous surface of the desired thickness for use in a super capacitor.

The coating of porous material deposited to the blank in accordance with the present invention can be formed without requiring that the electrode be cured following the application of each coating, and therefore the cost of the manufacture of the electrode is greatly reduced.

BRIEF DESCRIPTION OF THE DRAWINGS

A better understanding of the invention will be had after reading of the following detailed description taken in conjunction with the drawings, wherein:

FIG. 5 is a cross-sectional view of the grid shown in FIG. 3 positioned above the blank shown in FIG. 1 taken through line 5—5 of FIG. 3;

FIG. 6 is a cross-sectional of an empty container and mixing vat for use in the manufacture of an electrode in accordance with the present invention;

DETAILED DESCRIPTION OF A PREFERRED EMBODIMENT

The purpose of the present invention is to manufacture electrodes having high surface area at less expense than is currently being incurred. As a practical matter, such electrodes are manufactured in quantity. One method of simultaneously manufacturing a plurality of electrodes is to provide an enlarge electrode blank which can be subsequently divided into a plurality of electrodes.

Figure 1:
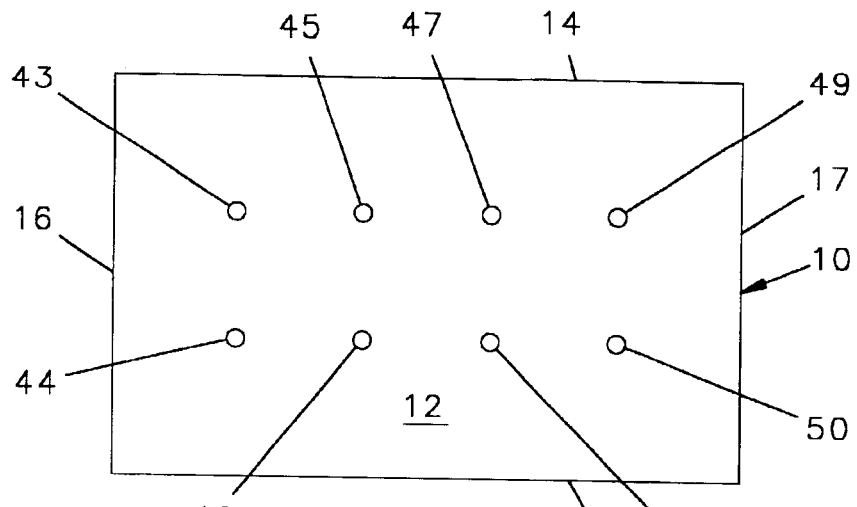
FIG. 1 is a front elevational view of a planar rectangular metal blank for forming a plurality of electrodes in accordance with the present invention.
Figure 2:
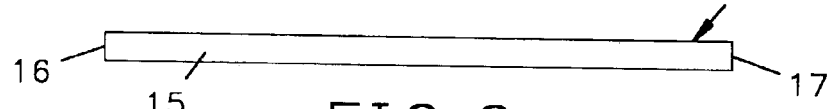
FIG. 2 is side-elevational view of the blank shown in FIG. 1.

Referring to FIGS. 1 and 2, an electrode blank 10, made of a suitable metal, has a generally planar surface 12 for receiving a coating of a porous conductive material, such as a metal oxide, and is generally rectangular in shape with long sides 14, 15 and short sides 16, 17. In the embodiment being depicted, the dimensions of the sides 14–17 are such that the long sides 14, 15 can be divided into fifths and the short sides 16, 17 divided into thirds to thereby divide the entire blank 10 into fifteen smaller blanks, each of which is suitable sized for use as a high volume electrode in a capacitor or battery.

Figure 3:
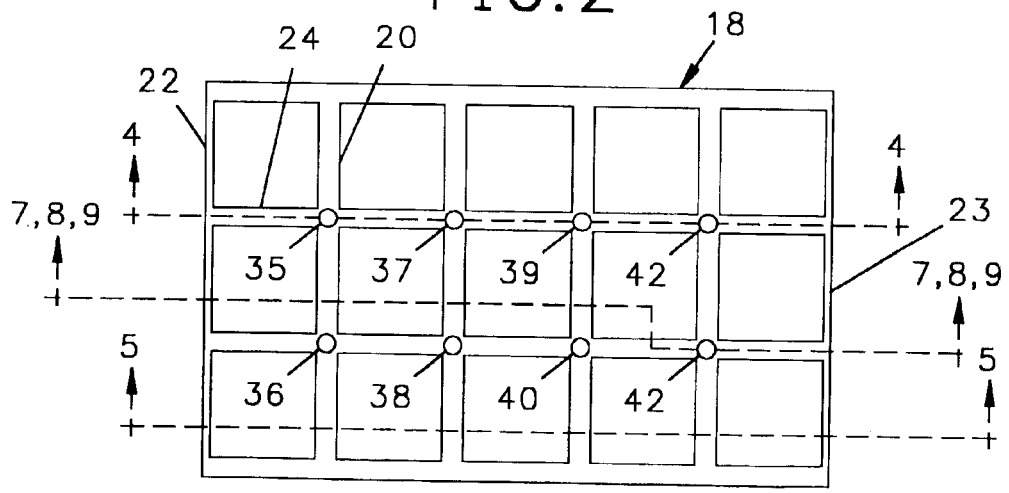
FIG. 3 is a front-elevational view of a frame having outer dimensions equal to outer dimensions of the blank shown in FIG. 1 and defining a grid of rectangular framed openings.
Figure 4:
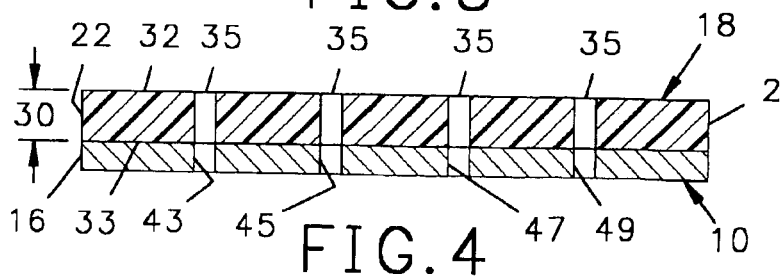
FIG. 4 is a cross-sectional view of the grid shown in FIG. 3 positioned above the blank shown in FIG. 1 taken through line 4—4 of FIG. 3.

Referring to FIGS. 3 and 4 the invention includes a frame 18 having long sides 20, 21 equal to long sides 14, 15 of blank 10 and short sides 22, 23 equal to short sides 16, 17 of blank 10. The frame 18 has a plurality of inner cross members, including long cross members 24, 25 equally spaced from each other and from the long sides 20, 21 and short cross members, 26, 27, 28, 29 all equally spaced from adjacent short cross members and from the short sides 22, 23 so as to divide the area defined within the long and short sides 20–23 into fifteen equally sized openings. The openings between parallel long sides and long cross members and parallel short sides and short cross members define the dimensions of a portion of an electrode to which metal oxide particles are to be deposited.

The frame 18 has a third dimension, perpendicular to both the long sides 14, 15 and short sides 16, 17 defining a thickness 30, which is at least as thick as the desired thickness for the coating of metal oxide to be deposited on the blank 10, the thickness 30 being the distance between an upper surface 32 and a lower surface 33 of the frame 18. As best shown in FIG. 3, the frame 18 further includes a plurality of transverse small diameter drain holes 35–42, each of which extends from the upper surface 32 through the frame to the lower surface 33 and are positioned at the intersections of the long and short cross members 24–29.

Referring to FIGS. 1, 2, and 5, the blank 10 also has a plurality of drain holes 43–50 extending perpendicular to the planar surface 12 and positioned so as to be aligned with the drain holes 35–42 of the frame 18 when the frame 18 is positioned against the planar surface 12 with the long sides 20, 21 of the frame 18 aligned with the long sides 14, 15 of the blank 10 and the short sides 22, 23 of the frame aligned with the short sides 16, 17 of the blank 10.

Referring to FIG. 6, a tank, or other container 51 suitable for holding liquid is provided, having side walls, two of which, 52, 53 are shown, and a bottom surface 61. The container 51 also has an input line 54 for injecting liquid into upper end of the container 51 and extending from the bottom of the container 51 is a drain line 55 through which liquid in the container 51 can be released. Inside the container 51 and between the walls 52, 53 are a plurality of supports, 57, 58 upon which the blank 10 can be suspended with the surface 12 thereof horizontal and directed upwardly. Above the blank 10 and aligned therewith is the frame 18. The walls 52, 53 of the container 51 are sized to snugly receive the long sides 14, 15, 20, 21 and the short sides 16, 17, 22, 23 of the blank 10 and frame 12, so that liquid emitted from the input line 54 on to the upper surface of the blank 10 must pass through the drain holes 35–42 of the frame 18 and the drain holes 43–50 of the blank 10 to reach the bottom of the container 51.

Adjacent the container 51 is a mixing vat 59 having an agitator 60 therein. The mixing vat 59 is filled with a liquid 62 suitable for holding particles of conductive material, such as a metal oxide, in suspension, and a quantity of powdered conductive material 64 is released from a dispenser 63 into the liquid 62 and blended into suspension by the agitator 60. The liquid 62 with the oxide powder 64 in suspension is then pumped by a pump 65 through the input line 54 into the container 51. Liquid 62 being released from the container 51 through the drain line 55 is recycled by a second pump 67 back to the mixing vat 59.

Figure 7:
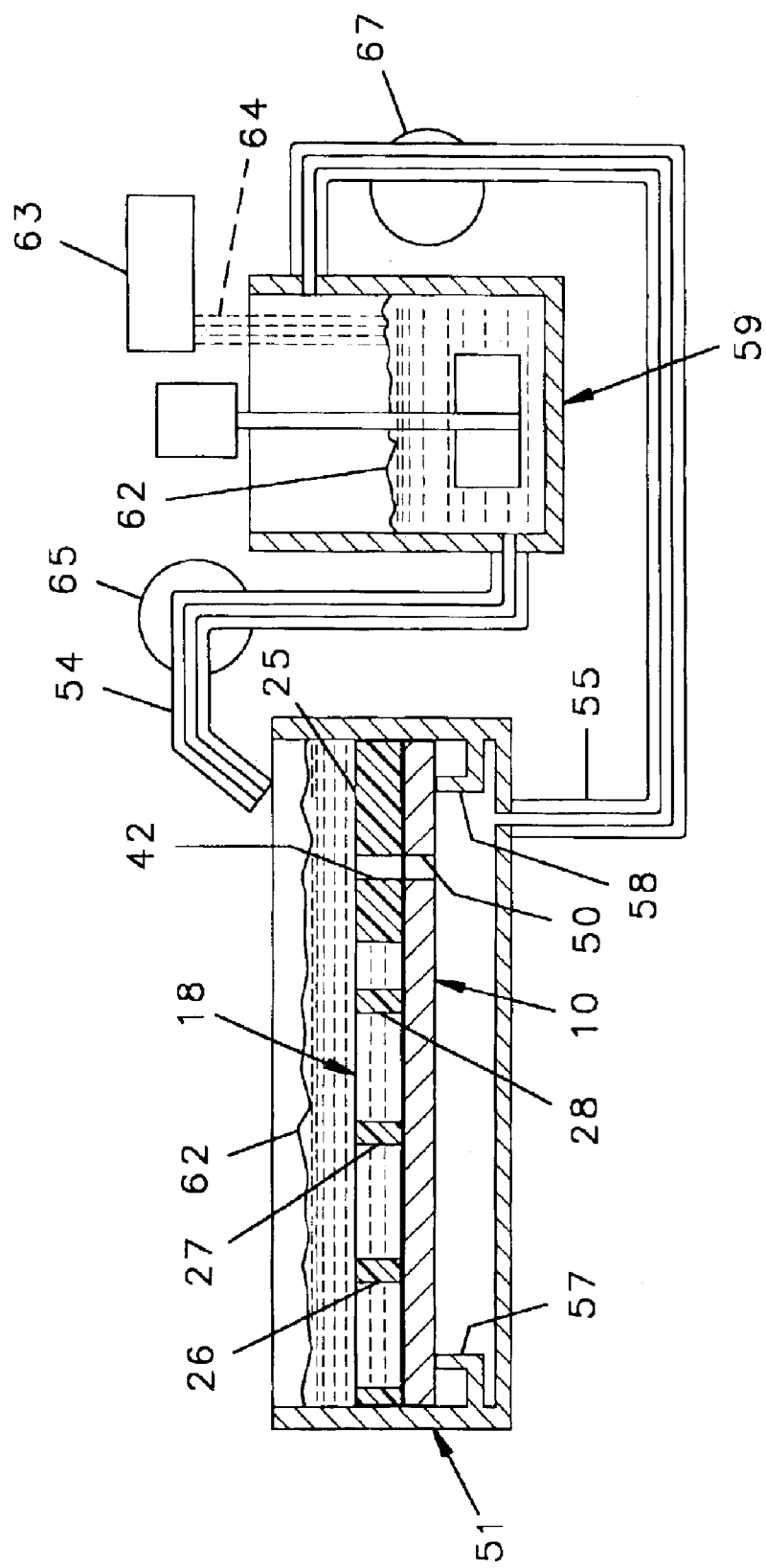
FIG. 7 is a cross-sectional view of the container shown in FIG. 6 with the blank and grid fitted therein and the container filled with liquid until the level of the liquid above the assembled blank is above the level of the grid, the grid and blank shown in cross-section through the line 7, 8, 9—7, 8, 9 shown in FIG. 3.
Figure 8:
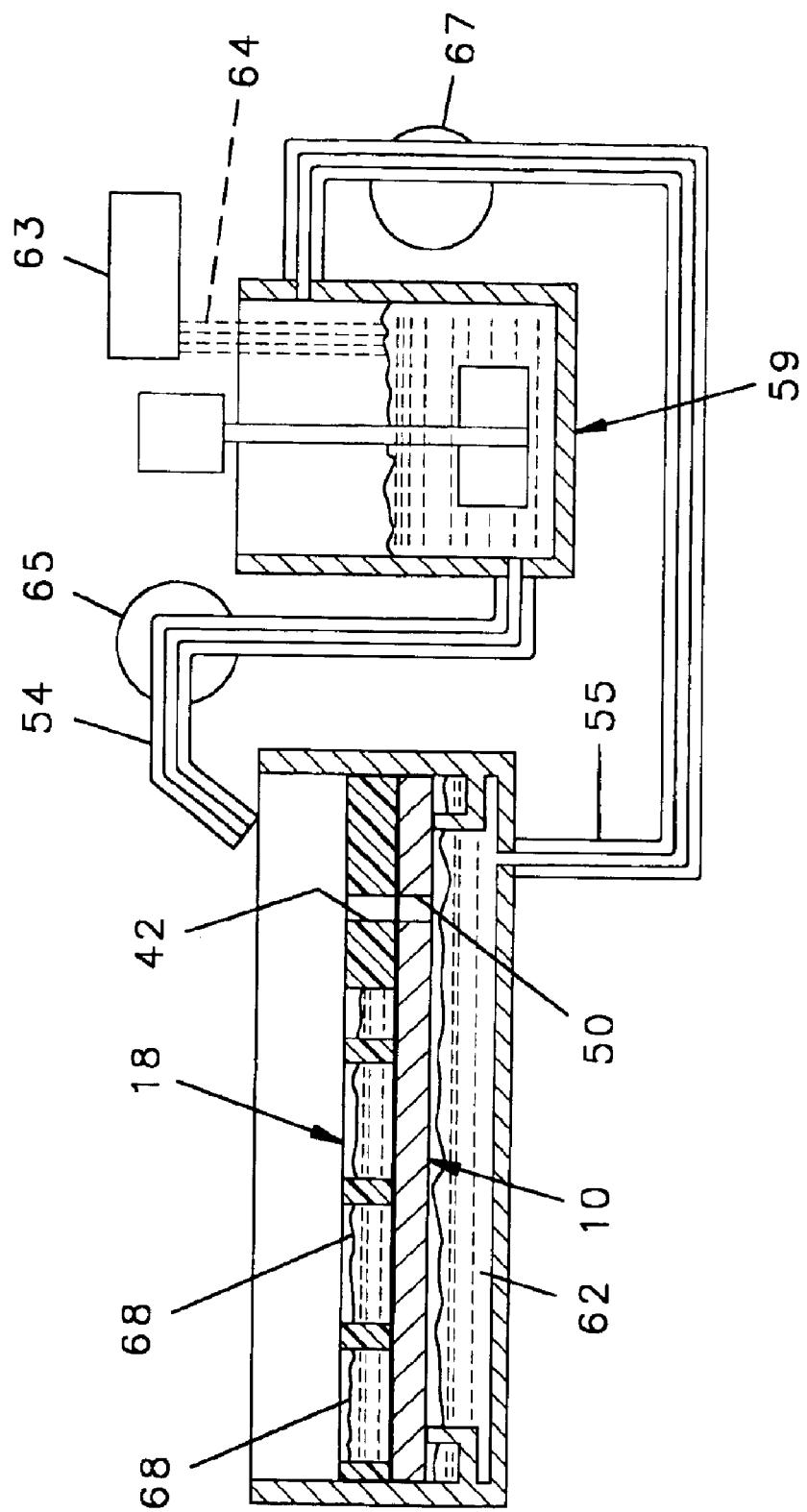
FIG. 8 is a cross-sectional view of the container shown in FIG. 6 after the level of the liquid therein has drained below the blank and the grid, the cross-section of the grid and blank taken through line 7, 8, 9—7, 8, 9 shown in FIG. 3.

Referring to FIGS. 7 and 8, to apply a coating of metal oxide particles 64, or any other electrically conductive particles, to the surface of the blank 10, a liquid 62 with the particles 64 in suspension is pumped by pump 65 from the vat 59 through input line 54 to the upper end of the container.51 until the liquid overflows the frame, and forms a pool above the blank 10 as shown in FIG. 7. The liquid 62 above the blank 10 will gradually drain through the drain holes 35–42 in the frame 18 and the drain holes 43–50 in the blank 10. In the preferred embodiment, the drain holes 35–50 are all sufficiently small that most of the metal oxide particles 64 in the pool of liquid 62 above the blank 10 will precipitate out of suspension before all the liquid above the blank 10 and frame 18 drains through the holes 35–50. Eventually, all the liquid 62 above the blank 10 will have drained through the drain holes 35–50, except for smaller pools 68 of liquid and concentrated metal oxide 64 trapped within the boundaries formed by the sides 20–23 and cross members 24–29 of the frame 18 as shown in FIG. 8. Once all the liquid 62 has drained through the drain holes 35–50 and the liquid in the bottom of the container 51 is pumped by pump 67 through the drain line 55 back to the mixing vat 59.

Since the blank 10 is retained by the supports 54, 56 with the surface 12 thereof horizontal, the particles of metal oxide 64 deposited on the surface 12 need not be bonded to the surface prior to receiving a second coating of particles. Accordingly, after the liquid trapped between the cross members of the frame 18 has been allowed to evaporate more liquid 62 with metal oxide powder 64 in suspension is pumped into the container 51 until the blank 10 and the frame 18 are again submerged as shown in FIG. 7. By repetition of the above described process, a coating of metal oxide particles deposited on the surface 10 can be built up to the desired thickness.

Figure 9:
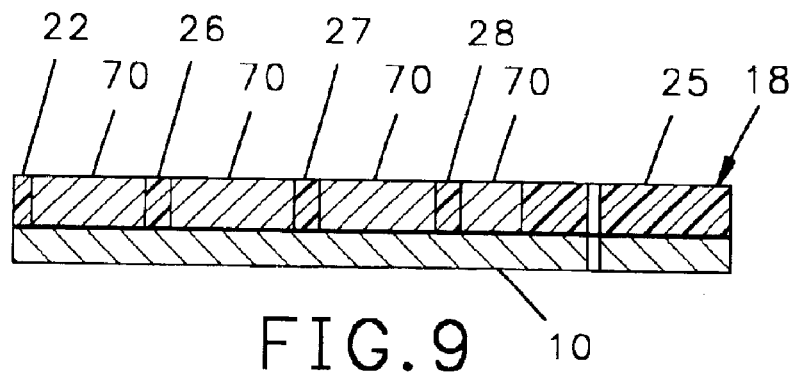
FIG. 9 is a cross-sectional view of the blank and grid after several layers of a porous conductive material have been deposited on the surface of the blank, the cross-section of the grid blank taken through line 7, 8, 9 shown in FIG. 3.
Figure 10:
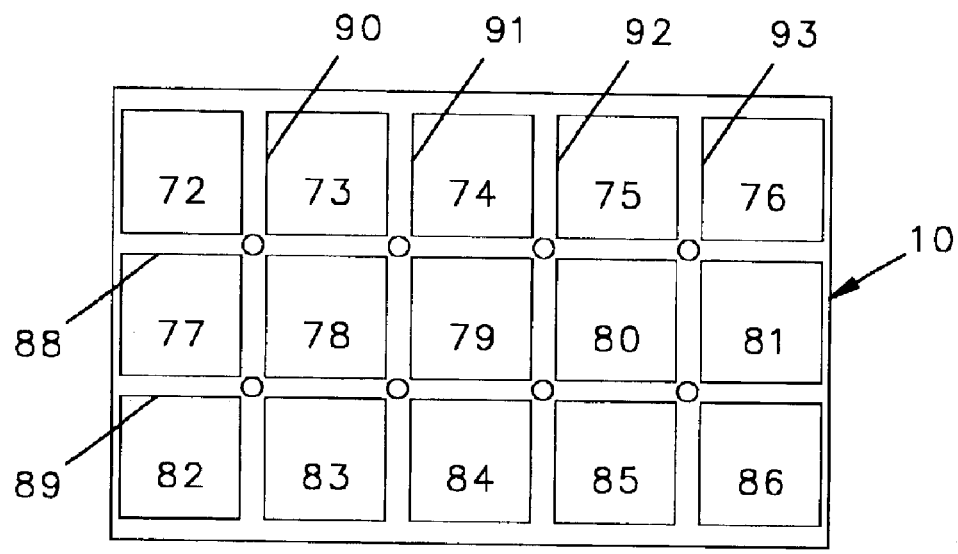
FIG. 10 is front-elevational view of the blank shown in FIG. 1 with the deposit of porous conductive material on the surface thereof as shown in FIG. 9 and with the grid shown in FIG. 3 removed therefrom.
Figure 11:
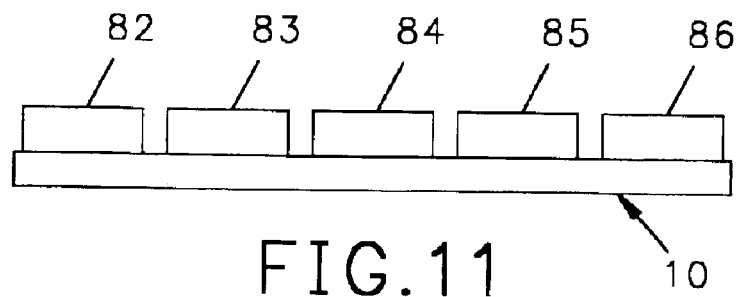
FIG. 11 is a side-elevational view of the blank with deposits on the surface thereof as shown in FIG. 10.

Referring to FIGS. 9 through 11, the blank 10 and frame 18 may thereafter be removed from the container 51 after which the frame 18 can be separated from the blank 10 leaving the blank 10 with a layer 70 of metal oxide particles deposited thereon. After the removal of the frame 18, the surface of the blank 10 will be as depicted in FIGS. 10 and 11 with raised rectangular panels of particles of conductive material 72–86 and separating the panels 72–86 are long division lines 88, 89 and perpendicularly oriented short division lines 90, 91, 92, 93 where no metal oxide has been deposited because of the presence of the cross members 24–29 of the frame 18. The blank 10 may be heat treated to bond the particles in the coating 70 to the blank 10 and thereafter the blank 10 maybe divided along the division lines 88–93 to provide individual large surface area electrodes for use in a super capacitor or the like.

While the present invention has been described with respect to a single embodiment, it will be appreciated that many modifications and variations may be made without departing from the spirit and scope of the invention. It is therefore intended that the appended claims cover all such modifications and variations which fall within the spirit and scope of the invention.

What is claimed:

1. A method of making a high surface area electrode comprising the steps of
   providing an electrode blank having a surface,
   providing means for supporting said electrode blank with said surface horizontal and facing upward,
   providing means to retain a liquid above said surface,
   providing means for draining liquid from above said electrode blank to a location below said electrode blank,
   providing a liquid,
   suspending metal electrically conductive particles in said liquid,
   filling said means for retaining with said liquid having electrically conductive particles suspended therein,
   allowing said electrically conductive particles to precipitate out of suspension and onto said surface and form a coating thereon,
   allowing said liquid to drain through said means for draining and out of said means for retaining,
   refilling said means for retaining with said liquid having electrically conductive particles suspended therein,
   allowing said electrically conductive particles to precipitate out of said liquid for a second time to form a thicker coating,
   allowing said liquid to drain through said means for draining and out of said means for retaining for a second time, and then
   bonding said electrically conductive particles to said surface.

2. The method of claim 1 wherein said electrically conductive particles are metal oxide particles and a heat treatment is used for bonding said metal oxide particles to said surface.

3. The method of claim 1 and comprising the further step of drying said electrically conductive particles on said surface prior to bonding said particles to said surface.

4. The method of claim 1 wherein the step of providing means for draining comprises providing at least one drain hole in said electrode blank, said at least one drain hole opening on to said surface.

5. The method of claim 1 and comprising the further step of
   providing a frame around a portion of said surface to form a liquid retention barrier.

6. The method of claim 5 wherein the step of providing means for draining comprises providing at least one drain hole in said electrode blank, said at least one drain hole opening on to said surface, and comprising the further step of
   providing at least one drain hole in said frame wherein said drain hole in said frame is aligned with said at least one drain hole in said electrode.

7. The method of making a high surface area electrode comprising the steps of
   providing a container for retaining a quantity of liquid,
   providing an electrode blank having a surface, said surface defining a plane,
   said electrode blank being provided with at least one drain hole extending therethrough and opening in said surface,
   providing means for supporting said electrode blank in said container with said surface maintained horizontal and facing upward,
   providing a frame around a portion of said surface to form a liquid retention barrier,
   providing at least one drain hole in said frame, said at least one drain hole in said frame aligned with said at least one drain hole in said electrode blank,
   providing a liquid,
   suspending electrically conductive particles in said liquid,
   filling said container with said liquid having electrically conductive particles suspended therein until the surface level of said liquid is above said surface and above said frame,
   allowing said electrically conductive particles to precipitate out of said liquid and onto said surface to form a coating thereon,
   allowing said liquid to drain through said at least one drain holes in said blank and in said frame, and
   bonding said electrically conductive particles to said surface.

8. The method of claim 7 comprising the further steps of refilling said container with said liquid having electrically conductive particles suspended therein; and allowing said electrically conductive particles to precipitate out of suspension in said liquid and onto said surface a second time prior to bonding said electrically conductive particles to said surface to form a thicker coating.

9. The method of claim 7 wherein said electrically conductive particles are metal oxide particles and said metal oxide particles are bonded to said surface by means of a heat treatment.

10. A method of making a high surface area electrode comprising the steps of providing a container for retaining a quantity of liquid, providing an electrode blank having a surface, providing means for supporting said electrode blank in said container with said surface maintained horizontal and facing upward, providing a frame around a portion of said surface to form a liquid retention barrier, providing means for draining liquid from above said electrode blank to a location below said blank, providing a liquid, suspending metal oxide particles in said liquid, filling said container with said liquid having electrically conductive particles suspended therein until the surface level of said liquid is above said surface of said electrode blank and above said frame, allowing said electrically conductive particles to precipitate out of suspension and form a coating on said surface of said blank, allowing said liquid to drain through said means for draining, refilling said container with said liquid having electrically conductive particles suspended therein, allowing said electrically conductive particles to precipitate out of suspension in said liquid and onto said surface a second time to form a thicker coating on said surface, and then bonding said electrically conductive particles to said surface.

11. The method of claim 10 wherein said electrically conductive particles are metal oxide particles and said metal oxide particles are bonded to said surface by means of a heat treatment.

12. The method of claim 10 wherein the step of providing means for draining comprises providing at least one drain hole in said electrode blank.

13. The method of claim 10 wherein the step of providing means for draining comprises providing at least one drain hole in said electrode blank and providing at least one drain hole in said frame, said at least one drain hole in said frame being aligned with said at least one drain hole in said electrode blank.

* * * * *